United States Patent
Hong et al.

(10) Patent No.: US 12,476,122 B2
(45) Date of Patent: Nov. 18, 2025

(54) SYSTEM FOR STABILIZING FLOW OF GAS INTRODUCED INTO SENSOR

(71) Applicants: ATIK CO., LTD., Seoul (KR); ATONARP INC., Tokyo (JP)

(72) Inventors: Young Ho Hong, Seoul (KR); Hyun Sik Choi, Bucheon-si (KR); Ki Woo Hong, Seoul (KR); Hirofumi Nagao, Tokyo (JP); Shinichi Miki, Tokyo (JP)

(73) Assignees: ATIK CO., LTD., Seoul (KR); ATONARP INC., Tokyo (JP)

( * ) Notice: Subject to any disclaimer, the term of this patent is extended or adjusted under 35 U.S.C. 154(b) by 496 days.

(21) Appl. No.: 17/792,947

(22) PCT Filed: Jan. 15, 2021

(86) PCT No.: PCT/KR2021/000582
§ 371 (c)(1),
(2) Date: Jul. 14, 2022

(87) PCT Pub. No.: WO2021/145716
PCT Pub. Date: Jul. 22, 2021

(65) Prior Publication Data
US 2023/0045932 A1 Feb. 16, 2023

(30) Foreign Application Priority Data
Jan. 17, 2020 (KR) .......................... 10-2020-0006792
Oct. 23, 2020 (KR) .......................... 10-2020-0137988

(51) Int. Cl.
*H01L 21/67* (2006.01)
*C23C 16/455* (2006.01)
(Continued)

(52) U.S. Cl.
CPC .. *H01L 21/67253* (2013.01); *C23C 16/45544* (2013.01); *C23C 16/52* (2013.01);
(Continued)

(58) Field of Classification Search
CPC ......... H01L 21/67253; H01L 21/67276; C23C 16/4412
See application file for complete search history.

(56) References Cited

U.S. PATENT DOCUMENTS 5,365,772 A * 11/1994 Ueda ...................... G01M 3/226
118/725
5,433,780 A * 7/1995 Ikeda .................. C23C 16/4412
118/50
(Continued)

FOREIGN PATENT DOCUMENTS

JP 2004069436 A 3/2004
JP 2010286476 12/2010
(Continued)

OTHER PUBLICATIONS

International Search Report—PCT/KR2021/000582 dated May 6, 2021.

*Primary Examiner* — Reinaldo Sanchez-Medina
(74) *Attorney, Agent, or Firm* — CANTOR COLBURN LLP

(57) ABSTRACT

Provided is a system for stabilizing a flow of gas introduced into a sensor, wherein, in connection with manufacturing equipment comprising a process chamber, a process chamber vacuum pump installed to remove internal gas of the process chamber, and a sensor device configured to be able to receive the internal gas of the process chamber through a sensor connecting pipe and to detect components thereof, the system comprises a sensor connecting pipe and a bypass pipe branching off from the sensor connecting pipe such that a part of the gas can be directly discharged to the outside without being introduced into the sensor, and the system is accordingly configured to stably provide the sensor device with a part of the internal gas within a predetermined range per time, regardless of a change in the pressure state of the process chamber.

8 Claims, 4 Drawing Sheets

(51) Int. Cl.
  *C23C 16/52* (2006.01)
  *G01N 1/22* (2006.01)
  *G01N 1/24* (2006.01)
  *G05D 7/06* (2006.01)

(52) U.S. Cl.
  CPC ............ *G01N 1/2226* (2013.01); *G01N 1/24* (2013.01); *G05D 7/0688* (2013.01); *H01L 21/67017* (2013.01)

(56) References Cited

U.S. PATENT DOCUMENTS

| | | | | |
|---|---|---|---|---|
| 5,575,853 | A * | 11/1996 | Arami | C23C 16/4412 |
| | | | | 118/712 |
| 6,936,108 | B1 * | 8/2005 | Saito | C23C 16/4412 |
| | | | | 118/724 |
| 7,604,010 | B2 * | 10/2009 | Hasebe | C23C 16/4412 |
| | | | | 216/60 |
| 7,883,581 | B2 * | 2/2011 | Nakaiso | C23C 16/4412 |
| | | | | 118/728 |
| 11,846,025 | B2 * | 12/2023 | Yachi | C23C 16/52 |
| 2009/0064765 | A1 * | 3/2009 | Megawa | H01J 37/32449 |
| | | | | 73/40.7 |
| 2021/0040619 | A1 * | 2/2021 | Yachi | C23C 16/52 |

FOREIGN PATENT DOCUMENTS

| | | |
|---|---|---|
| KR | 20060042741 | 5/2006 |
| KR | 20080098813 | 11/2008 |
| KR | 20090068058 | 6/2009 |
| KR | 20190124397 | 11/2019 |

\* cited by examiner

SYSTEM FOR STABILIZING FLOW OF GAS INTRODUCED INTO SENSOR

TECHNICAL FIELD

The present invention relates to equipment related to manufacturing of a semiconductor device and, more specifically, to a sensor gas flow stabilization system, which is added to a sensor device sensing a process state to stabilize an amount of gas flown from a process chamber into a sensor device at an appropriate level.

BACKGROUND ART

Manufacturing equipment, such as a semiconductor device or a display device, is configured to match various conditions for a variety of manufacturing processes. In such processes, a deposition process, such as PVD or CVD, an etching process, such as a dry etching process, and the like, are performed under a low-pressure vacuum environment.

In such an environment, since the degree of deposition or etching is directly associated with the performance or failure of the semiconductor device to be completed, it must be controlled very precisely, and almost all of the elements, such as time, temperature, and an amount of supplied source gas, are controlled very precisely.

Moreover, in order to sense completion time of the process or to detect an important state and a time point of other processes, various types of sensors are used for each process.

Some of the sensors may be provided on a process chamber itself, and some of the sensors may be provided in a space other than the process chamber. In this instance, a target element to be detected to sense the state of the process performed in the process chamber must be transferred to the sensors.

FIG. 1 is a conceptual configuration diagram illustrating a combination between a process chamber and a sensor device for sensing the process chamber in a conventional semiconductor device manufacturing apparatus.

Here, disclosed are a process chamber 10, a turbo pump 13 for providing vacuum to the process chamber, a dry pump 14, and a pump connection pipe 15 connected to the vacuum pump to discharge internal gas from the process chamber 10 to the outside. The combination of the dry pump and the turbo pump is just one example of the vacuum pump, and other types and configurations of the vacuum pump may be possible.

Reference numeral 11 denotes a residual gas analyzer 11, P1 denotes a vacuum pressure gauge of the process chamber. When information sensed by the above components is input to a process gas control system 40, the process gas control system gives a control signal to a control valve of a pipe to which a mass flow controller (MFC) 50 mounted on the pipe from three gas supply sources A, B and C is attached, thereby controlling a gas ratio and a flow rate of gas introduced into the process chamber.

A turbo molecular pump 13 and a dry pump 14 for maintaining an inner space at high vacuum by discharging internal gas are connected to the process chamber 10, a sensor connection pipe 30 branches off from the pump connection pipe 15 through a connection port 31 so that some of the internal gas is introduced into a sensor device 20.

A needle valve (not shown) may be mounted at an inlet of the sensor device, and a vacuum pump composed of the combination of the turbo molecular pump and the dry pump to maintain the high vacuum state of about 10-6 Torr and a vacuum pressure gauge (P2) 22 for measuring the internal vacuum level or atmospheric pressure accurately are installed in the sensor device.

Here, a mass spectrometer (MS) is used as the sensor device 20. There are various known types for MS, such as a time of flight (TOF) type, a quadrupole (TMS) type, and the like. For example, for a target material, an ionization-mass analyzer separates a sample to obtain information on element composition of the sample material and structural information of molecules and to perform quantitative analysis and qualitative analysis of a material to be analyzed.

FIG. 2 is a box type conceptual diagram illustrating configuration of a mass spectrometer (MS).

In FIG. 2, the sensor device 20 includes a gas inflow device 23, such as an orifice or a valve or an analyzing device such as a chromatography, an ion source (ionization device) 24, a mass analyzer 25, and a detector 26 in one envelop 21. When a sample is introduced from the outside, the sample is ionized through electron impact or laser irradiation. The number of ionized sample materials per second by pass can be measured through the mass analyzer and the detector, and detection result data is transferred to a data system.

The above configuration has been well known, and so, further detailed description about the sensor device will be omitted.

In the above configuration, the sensor device and the process chamber are spatially connected so that the sensor device can analyze gas in the process chamber, thereby performing confirmation of process progress conditions, end point detection (EPD), monitoring of by-product generation, etc., and controlling the amount, ratio, time, etc. of source gas injected through the analysis of the process so as to obtain effects of process improvement and time reduction.

However, in such a configuration, the inside of the process chamber can change rapidly depending on process situations, thereby significantly changing an inflow rate of a target sample introduced into the inlet of the MS which is the sensor device.

That is, in general, pressure during the process of the process chamber is 10-5 Torr or more, the vacuum degree or pressure inside the MS is varied to about 5*10-5 to 5*10-6 Torr. If the process chamber is lower in vacuum or higher in pressure than the MS, the inflow rate of the sample into the inlet of the sensor device (internal gas of the process chamber) exceeds to increase a sensor analysis value, and so, it may cause a stagnation phenomenon in a pipeline (connection pipe between the process chamber and the sensor device). In contrast, the process chamber is higher in vacuum or lower in pressure than the MS, the inflow rate of the sample is decreased and the sensor analysis value is also decreased, and so, it may cause a backflow phenomenon in the process chamber and may act as a particle source of the process chamber. Therefore, countermeasures are needed.

Therefore, it is preferable that the pressure of the process chamber and the internal pressure of the sensor device are maintained at a similar level but the pressure of the process chamber is slightly higher than the internal pressure of the sensor device. However, the pressure of the process chamber is rapidly changed by an inflow rate of gas or the like.

In order to increase reliability of the measurement value or measurement data of the sensor device, it is required to constantly maintain pressure in a pipeline space between the sensor device and the process chamber connected to the inlet of the sensor device.

Technical Problem

Accordingly, the present invention has been made in view of the above-mentioned problems occurring in the related art, and it is an object of the present invention to provide a gas flow stabilization system, which can prevent a sensor analysis value from changing significantly and reliability of analysis value data from lowering while internal pressure of a sensor device added to the conventional manufacturing equipment changes rapidly according to a change in pressure of a process chamber.

Technical Solution

To accomplish the above-mentioned objects, according to the present invention, there is provided a sensor gas flow stabilization system.

The sensor gas flow stabilization system in manufacturing equipment, which includes a process chamber, a vacuum pump for the process chamber mounted to remove internal gas of the process chamber, and a sensor device receiving the internal gas of the process chamber through a sensor connection pipe to detect elements, includes: the sensor connection pipe; and components disposed on the sensor connection pipe, for instance, a bypass pipe for discharging gas from the sensor connection pipe to the outside without introducing it into the sensor device, to stably provide some of the internal gas of the process chamber to the sensor device within a predetermined range per unit time even though there is a change in pressure of the process chamber.

The sensor gas flow stabilization system according to an embodiment of the present invention includes a sensor connection pipe, an orifice connecting the sensor device to the sensor connection pipe, and a bypass pipe connected with the sensor connection pipe at a portion where the orifice is connected to the sensor connection pipe.

In this instance, the sensor connection pipe, the bypass pipe, and the sensor device may be respectively connected with three branches of a splitter adaptor. In this instance, an orifice may be fixed or replaceably mounted at the branch connecting the sensor device to the splitter adaptor, among the three branches.

In this instance, the sensor connection pipe may be provided with a vacuum pressure gauge, and a manually operated vacuum pump may be included on the bypass pipe as a vacuum pump for a stabilization system.

In this instance, the sensor gas flow stabilization system according to an embodiment of the present invention further includes a valve for controlling or restraining an gas flow, which is disposed on the sensor connection pipe located at the front side of the vacuum pump for the stabilization system mounted on the bypass pipe or at the front side of the orifice, wherein the 'front side' means a portion where the front portion of the gas flow passes in the pipe.

The sensor gas flow stabilization system according to an embodiment of the present invention includes a splitting structure. The splitting structure may include a vacuum pressure gauge mounted in the sensor connection pipe to measure pressure, a bypass pipe, a vacuum pump mounted on the pipe, a control valve mounted on the bypass pipe, and a controller for controlling the control valve by sensing pressure of the vacuum pressure gauge.

At this time, the control valve may be controlled by a controller in a proportional control method or a pulse width modulation (PWM) control method.

Advantageous Effects

The sensor gas flow stabilization system according to the present invention can prevent problem situations, for example, degradation of reliability of analysis value data caused by a large change in the sensor analysis value while the internal pressure of the MS, which is the sensor device connected with the process chamber to which vacuum is applied is changed rapidly according to a change in pressure of the process chamber, or delay in that the sensor device senses the current state of the process chamber.

The sensor gas flow stabilization system according to the present invention can increase the lifespan of the sensor device and reduce a management burden by reducing necessity of maintenance.

MODE FOR INVENTION

Hereinafter, the present invention will be described in more detail with reference to the drawings.

Figure 1:
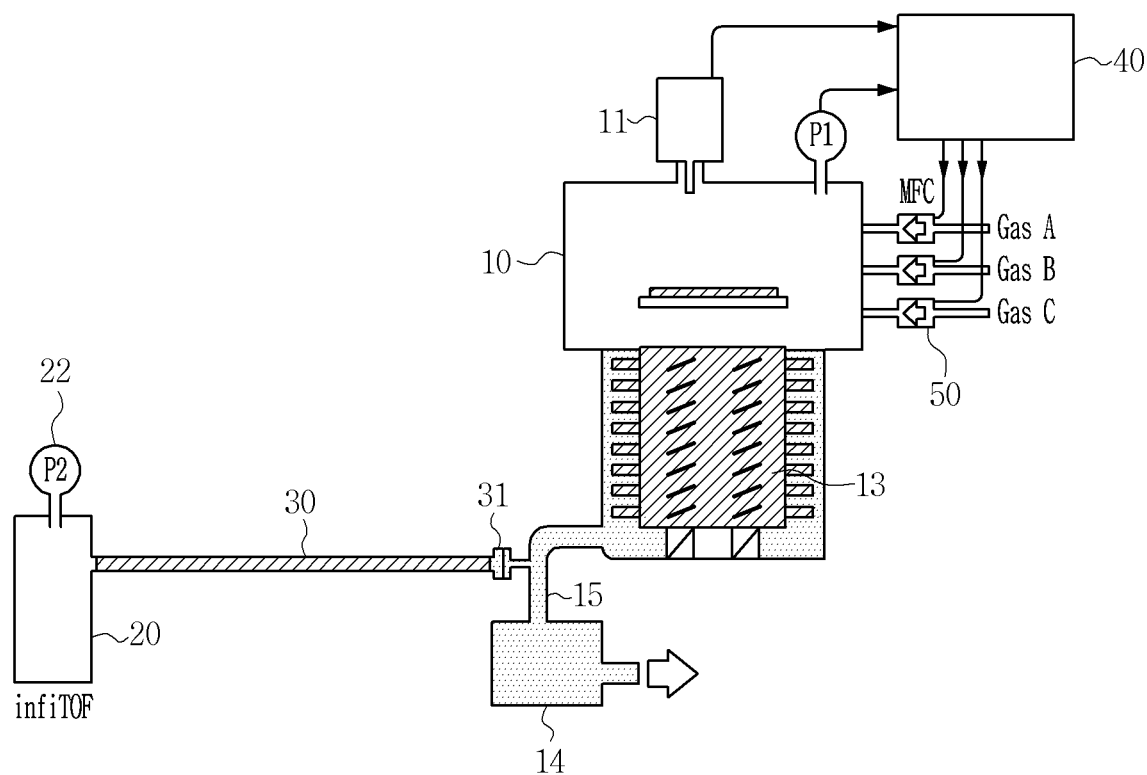
FIG. 1 is a conceptual diagram illustrating a combination of a process chamber and a sensor device for sensing the process chamber in a conventional semiconductor device manufacturing apparatus.
Figure 2:
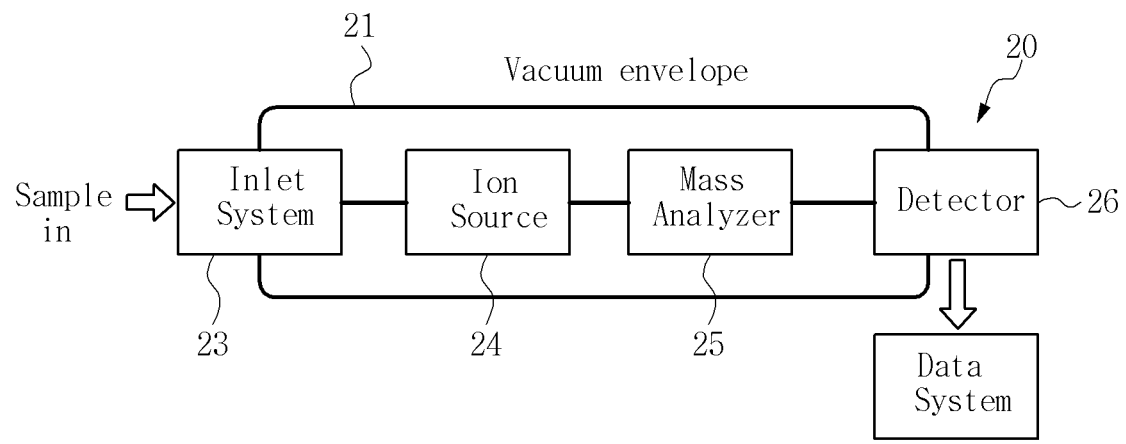
FIG. 2 is a conceptual diagram illustrating a mass spectrometer (MS) as a sensor device.
Figure 3:
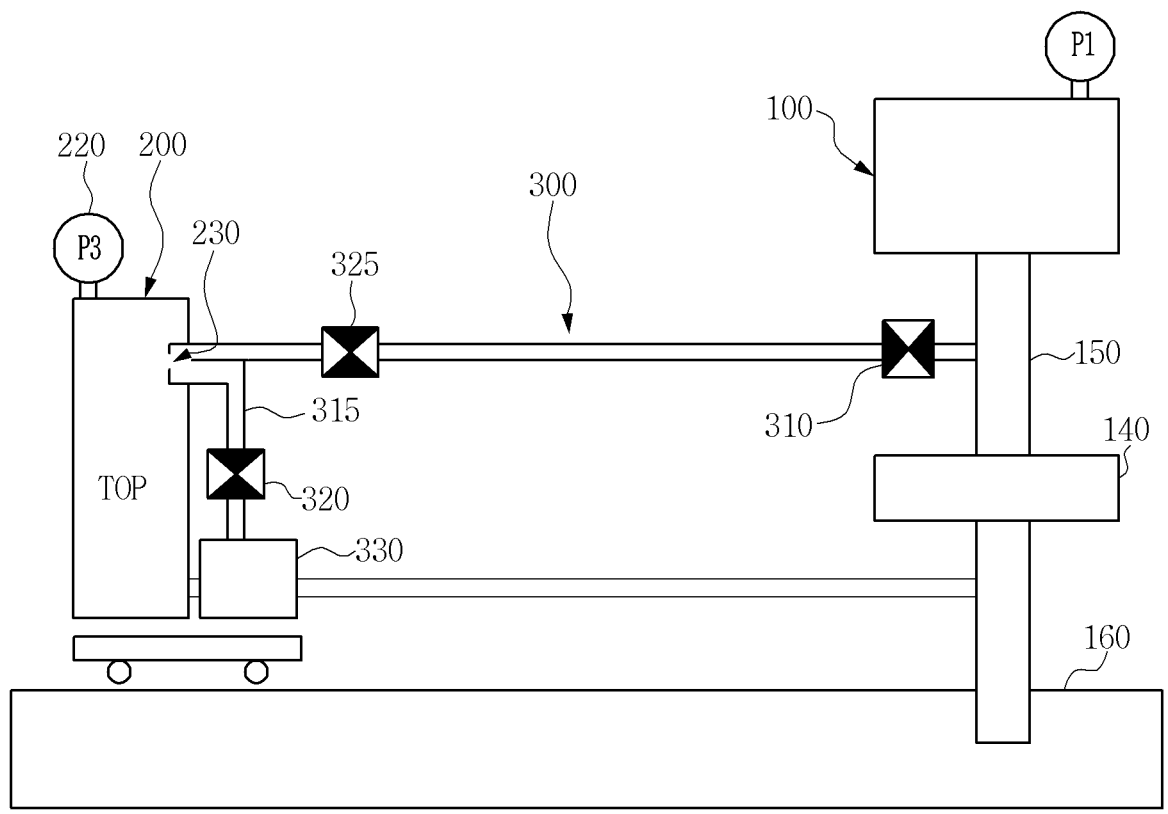
FIG. 3 is a conceptual diagram illustrating a gas flow stabilization system and peripheral components according to an embodiment of the present invention.

FIG. 3 is a conceptual diagram illustrating a sensor gas flow stabilization system of a semiconductor device manufacturing equipment and peripheral components according to an embodiment of the present invention.

As compared to the stabilization system of the conventional semiconductor device manufacturing equipment, the stabilization system according to an embodiment of the present invention further includes: an orifice 230 formed at the end of a sensor connection pipe 300 connecting a process chamber 100 and a sensor device 200 through a port; a bypass pipe 315 mounted at a portion of the pipe where the orifice is formed; and a dry pump 330 mounted on the bypass pipe to be operated manually. An operator can control a flow of gas and a flow rate of gas through the dry pump 330 and a valve mounted thereon while monitoring vacuum pressure gauges mounted at their positions. The stabilization system according to the embodiment of the present invention may further include: a control valve 320 mounted at the front side of the dry pump 330 for the stabilization system; and a control valve 325 mounted at a part close to the orifice of the sensor connection pipe.

Here, an inlet of the dry pump 330 for the stabilization system is connected to the sensor connection pipe 300 through the portion of the pipe in which the orifice 230 is mounted, and an outlet of the dry pump is connected to a process chamber vacuum line 150 at the rear side of the vacuum pump 140 for the process chamber coupled to the process chamber 100 together with an outlet of the sensor device, thereby discharging gas to a vacuum line 160 of equipment.

Although not explicitly shown in the drawings, the sensor connection pipe, the bypass pipe, and the sensor device may be respectively connected to three branches of a splitter adaptor, and in this instance, an orifice may be fixed or replaceably mounted in one branch connecting the splitter adaptor and the sensor device among the three branches.

The dry pump 330 for the stabilization system spatially connected to the sensor connection pipe 300 removes residual gas, which did not flow into the sensor device (MS) 200, from the sensor connection pipe 300. The orifice 230 is mounted in the pipe at the inlet of the sensor device 200 so as to uniformly control the flow rate of the gas introduced into the sensor device 200 in the pipe.

According to such a configuration, the present invention can prevent a data distortion caused by a change in pressure of the process chamber 100 and a data delay caused by a dead space (dead volume) of the sensor connection pipe 300.

This embodiment can help maintain the stability of the sensor device 200 compared to the prior art. However, since the operator controls the dry pump 330 for the stabilization system manually, it is necessary to adjust the size of the orifice 230 according to pressure conditions of the process chamber 100 to replace the orifice 300, and it is difficult to rapidly cope with a sudden change in pressure of the process chamber 100.

Of course, if an adjustable needle valve (not shown) is mounted in the inlet of the sensor device 200 instead of the orifice 230, it can reduce such inconvenience, but it is still insufficient to rapidly respond.

Figure 4:
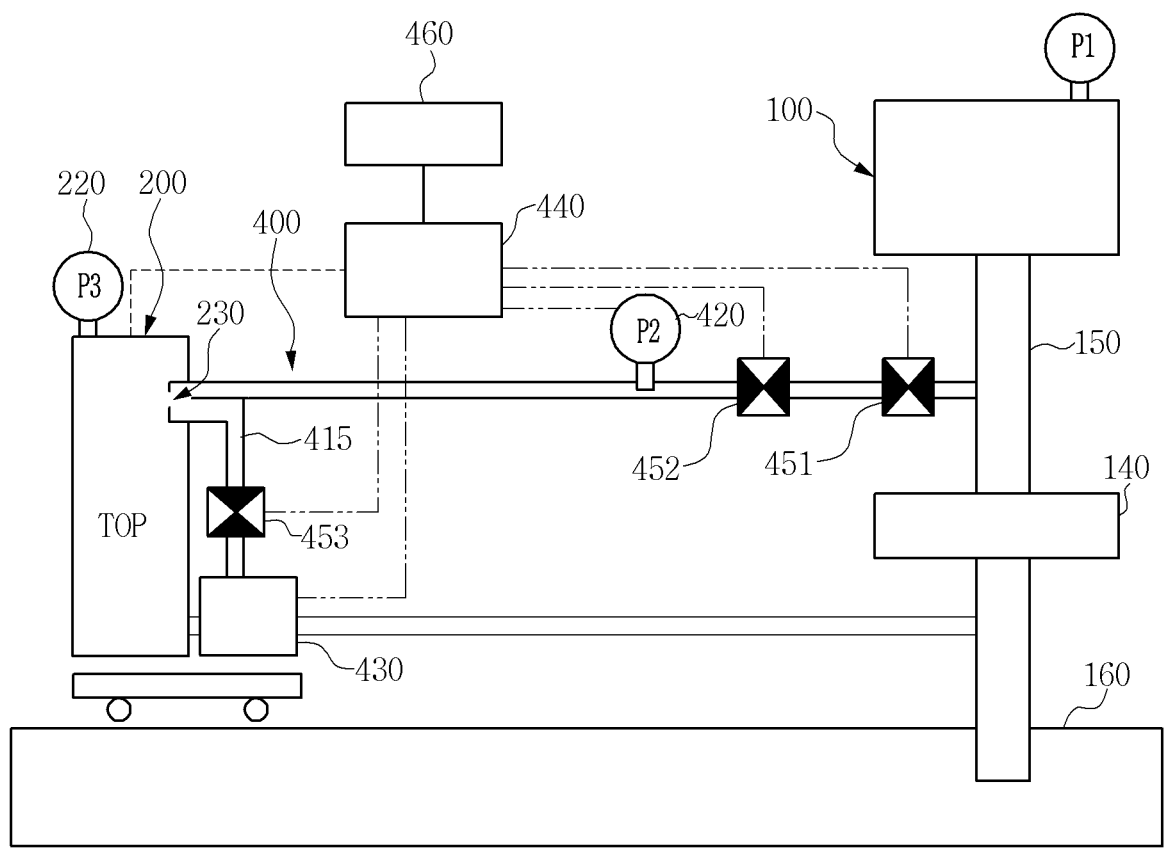
FIG. 4 is a conceptual diagram illustrating a gas flow components according to stabilization system and peripheral another embodiment of the present invention.

FIG. 4 illustrates an embodiment of mounting a splitting structure as a kind of gas flow stabilization system in the sensor connection pipe 400 between the process chamber 100 and the sensor device 200.

Here, an automatic control type gas flow stabilization system is installed instead of the gas flow stabilization system having the bypass pipe and the dry pump 330 illustrated in FIG. 3. The gas flow stabilization system includes a first automatic valve 451 and a second automatic valve 452 mounted in a port through which gas of the process chamber 100 is introduced into the sensor connection pipe 400, wherein the first automatic valve 451 is an on/off valve to serve a shutdown function, and the second automatic valve 452 is a flow rate control valve or a pressure control valve. The first automatic valve and the second automatic valve are controlled by a stabilization system controller 440 which receives a sensing signal of a vacuum pressure gauge (P2) 420.

The gas flow stabilization system further includes: a dry pump 430 for a stabilization system mounted in a branch pipe or a bypass pipe 415 branching off from the sensor connection pipe 400 at the portion near the orifice 230; and a third automatic valve 453 mounted in the bypass pipe 415. An outlet of the dry pump 430 for the stabilization system is connected to the process chamber vacuum line 150 at the rear side of the vacuum pump 140 for the process chamber coupled to the process chamber 100 together with an outlet of the sensor device 200 as shown in FIG. 3, thereby discharging gas to the vacuum line 160 of equipment. The third automatic valve 453 and the dry pump 430 for the stabilization system may be controlled by the stabilization system controller 440 receiving a sensing signal of a vacuum pressure gauge (P2) 420 for the stabilization system.

Meanwhile, the stabilization system controller 440 may be connected to an operator interface 460 to be controlled by the operator at a remote place as shown in FIG. 4, thereby enabling remote control.

In addition, the stabilization system controller 440 may have a scheduler function interworking with a timer and operated by a pre-input program. In this instance, the stabilization system controller 440 is capable of operating the equipment to operate and stop the components of the stabilization system, such as the valve or the vacuum pump of the stabilization system, at a pre-reserved time, and is capable of starting and stopping operation of the stabilization system controller 440 at predetermined time since the stabilization system controller 440 can send and receive signals to and from the sensor device and interwork with the sensor device.

For example, the stabilization system controller 440 can allow the operator to remotely control the MS and the splitting structure at the same time, and make the MS perform measurement only when chamber gas is supplied by opening the on/off valve 451 and the automatic valve 452 at the predetermined time through the scheduler function, and make the MS stop the measurement when the valve is completely closed.

Through the above configuration, the gas flow stabilization system according to the present invention can automatically control sample gas to be uniformly introduced into the MS regardless of the process pressure change in the process chamber.

The inlet of the sensor device is provided with an orifice or a metering valve to uniformly control an amount of gas flowing into the sensor device. Additionally, the gas flow stabilization system according to the present invention can remove residual gas, which is not introduced into the sensor device, from a sample line (the pipe) by using the branch pipe connected to the pipe and the dry pump mounted in the branch pipe so as to prevent a data delay.

In addition, the vacuum pressure gauge for the stabilization system mounted in the connection pipe continuously transfers pressure values to the controller, and the controller controls each of the automatic valves so as to constantly maintain pressure in the connection pipe regardless of the pressure of the process chamber.

The valve which is automatically controlled will be described in more detail. The automatic control valve may be an atomic layer deposition (ALD) valve or a proportional control valve capable of controlling a minute flow rate, which is used conventionally.

Since being conventionally used, the ALD valve is relatively easy to construct a system by being easily adopted from ready-made articles. Such an automatic valve may include a pulse width modulation (PWM) circuit for control. For such a PWM control, the controller receives pressure of the front side of the pipe dry pump (pressure in the pipe), and determines an opening and closing cycle of the automatic valve through feedback.

However, the ALD valve has a disadvantage in that there is severe pressure damping at less than 10 Hertz, the lifespan of the valve can be significantly reduced, and the configuration thereof is large and complicated.

Meanwhile, the proportional control valve may include a metering valve as a flow control valve and a server actuator for automatically controlling a flow rate of the metering valve. The proportional control valve may also include a vacuum pressure gauge for measuring the degree of vacuum like the ALD valve.

The proportional control valve does not cause a pressure damping phenomenon since linearly controlling the opening and closing amount by the opening and closing action, provides a stable control using the proven metering valve, is not reduced in the lifespan since having the same lifespan as the valve body, and allows a heat to be mounted easily. However, in order to configure the novel proportional control valve, it is necessary to develop a controller combination suitable for the proportional control valve.

Furthermore, in addition to the configuration in these embodiments, the gas flow stabilization system according to an embodiment of the present invention may include a heat jacket or a heater of another type mounted on the connection pipe or the valve to control temperature of the connection pipe and the splitting structure, thereby preventing process by-products from being deposited inside the pipe and an analysis value (a measurement value or a sensing value) of the sensor device from being changed due to a change in pressure by a temperature change in the space.

In this instance, the controller can also control temperature of the pipe through the heater. In this case, it is necessary that the temperature sensor is mounted on an orifice or a valve of the inlet of the connection pipe or the sensor device to transfer the temperature of the gas in the connection pipe, in components connected to the connection pipe, or in the connection pipe by the controller.

Now, the controller for the stabilization system necessary for automatic control will be described in more detail. The controller is configured to automatically control all of the components of the gas flow stabilization system, or is configured to automatically control some limited components and manually control some of the components. The controller may automatically control the automatic valve for controlling an amount of gas introduced from the process chamber by receiving pressure information from the sensor connection pipe and manually control the vacuum pump mounted in the bypass pipe or the valve mounted on the vacuum pump.

The controller may have an automatic valve control function and a heater control function, and the heater control may be recognized as a temperature control function. Additionally, the controller can control the dry pump, which s a vacuum pump combined with the pipe, in an ON/OFF method.

The controller may be a computer to directly control the above components, but may be combined with an existing computer to control the above components by transferring a control signal through the computer. Of course, in this case, it is necessary that the computer include a program, which is software to receive a signal from the controller and generate and transmit a signal to control each component.

While the present invention has been described through the limited embodiments, this is provided only to help the overall understanding of the present disclosure and the present disclosure is not limited to the exemplary embodiments. It will be understood by those skilled in the art to which the present disclosure belongs that various modifications and changes may be made from the description.

Therefore, it will be understood by those of ordinary skill in the art that various changes, modifications, and equivalents may be made therein without departing from the technical idea and scope of the present invention and such changes, modifications, and equivalents belong to the claims of the present invention.

The invention claimed is:

1. A sensor gas flow stabilization system in manufacturing equipment, the system comprising:
    a process chamber;
    a process chamber vacuum line;
    a sensor device having an inlet and an outlet, wherein the outlet of the sensor device is connected to the process chamber vacuum line;
    a sensor connection pipe connecting the processing chamber to the inlet of the sensor device at an end of the sensor connection pipe, wherein the sensor device is configured to receive an internal gas of the process chamber through the sensor connection pipe;
    a bypass pipe connected to the end of the sensor connection pipe, wherein the bypass pipe is configured to discharge part of the internal gas flowing through the sensor connection pipe in such a manner that the internal gas of the process chamber can be stably provided to the sensor device within a predetermined range per unit time even though there is a change in a pressure of the process chamber; and
    a vacuum pump connected to a process chamber vacuum line to remove the internal gas of the process chamber.

2. The system according to claim 1, wherein the sensor device includes an orifice formed at the inlet of the sensor device,
    the sensor connection pipe connects the process chamber to the orifice of the sensor device,
    the bypass pipe is connected to the end of the sensor connection pipe at a portion where the orifice connecting the sensor connection pipe and the sensor device is mounted, and
    a dry pump is mounted on the bypass pipe, the outlet of the sensor device being connected to the process chamber vacuum line through the dry pump.

3. The system according to claim 1, further comprising: a vacuum pressure gauge to measure gas pressure in the sensor connection pipe, wherein the vacuum pump is configured to allow the vacuum pressure gauge to be controlled manually.

4. The system according to claim 1, further comprising:
    a vacuum pressure gauge to measure gas pressure in the sensor connection pipe;
    an automatic valve mounted at an inlet portion for receiving the internal gas of the process chamber in the sensor connection pipe; and
    a controller for receiving pressure information sensed by the vacuum pressure gauge, adjusting a gas inflow amount through the automatic valve, and controlling operation of the vacuum pump.

5. The system according to claim 4, wherein the automatic valve is controlled by a proportional control method or a pulse width modulation (PWM) control method by the controller.

6. The system according to claim 4, wherein the sensor connection pipe or the automatic valve is provided with a heater and a temperature sensor, and the controller is configured to receive the temperature information of the temperature sensor to control operation of the heater.

7. The system according to claim 4, wherein the automatic valve includes a first automatic value and a second automatic valve.

8. The system according to claim 2, wherein the sensor connection pipe, the bypass pipe, and the sensor device are respectively connected to three branches of a splitter adaptor, and
    wherein the orifice is mounted in a branch connecting the splitter adaptor and the sensor device with each other.

* * * * *